(12) United States Patent
Hata

(10) Patent No.: US 6,495,836 B1
(45) Date of Patent: *Dec. 17, 2002

(54) TWO-DIMENSIONAL IMAGE PICKUP APPARATUS

(75) Inventor: Fumio Hata, Mitaka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/237,921

(22) Filed: Jan. 27, 1999

(30) Foreign Application Priority Data

Jan. 30, 1998 (JP) .......................................... 10-018810

(51) Int. Cl.$^7$ ................................................. G01T 1/29
(52) U.S. Cl. ............................... 250/370.09; 250/370.11
(58) Field of Search ........................ 250/370.09, 370.11

(56) References Cited

U.S. PATENT DOCUMENTS 5,777,335 A * 7/1998 Mochizuki et al. .... 250/370.11
5,804,832 A * 9/1998 Crowell et al. ........ 250/370.09

* cited by examiner

*Primary Examiner*—Constantine Hannaher
*Assistant Examiner*—Andrew Israel
(74) *Attorney, Agent, or Firm*—Fitzpatrick, Cella, Harper & Scinto

(57) ABSTRACT

A compact and lightweight two-dimensional image pickup apparatus comprises two-dimensional photoelectric converters arranged on a substrate, a base member for supporting the substrate, electronic parts for processing the electric signals of said photoelectric converters and an apparatus cabinet containing the above components, wherein said base member is formed by a metal-based printed circuit board and said electronic parts are mounted on said base member or, alternatively, said base member and part or all of said apparatus cabinet are formed by a metal-based printed circuit board and said electronic parts are mounted on said printed circuit board.

12 Claims, 2 Drawing Sheets

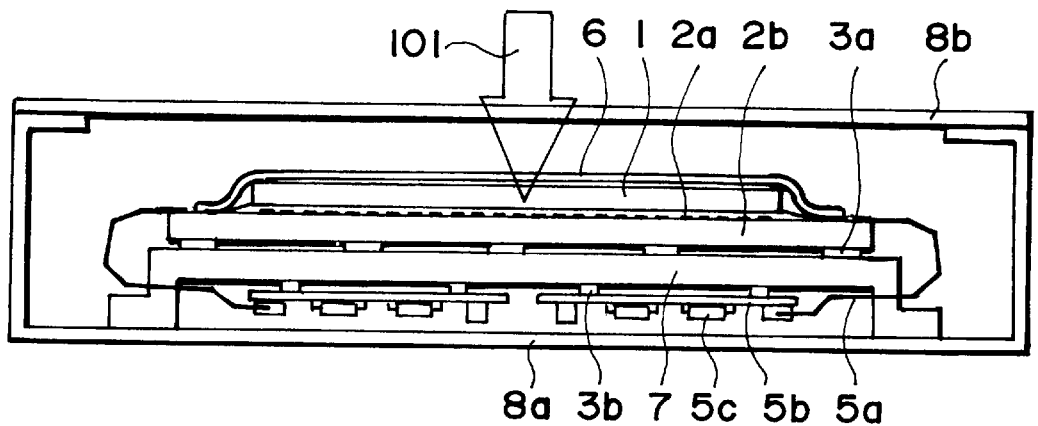
F I G. 1
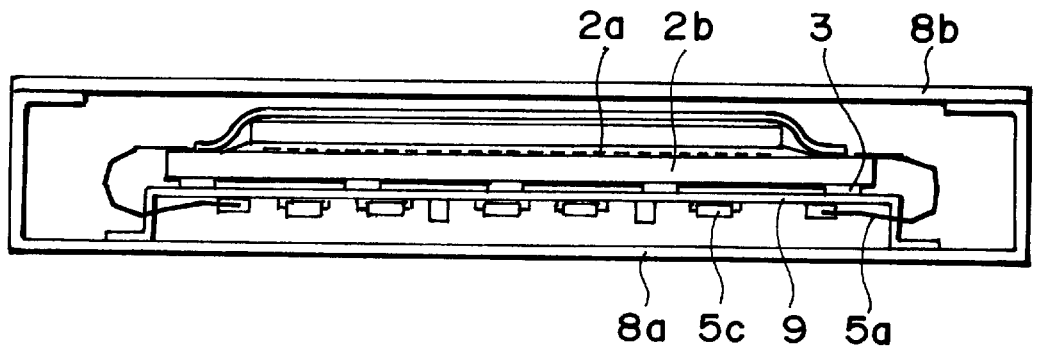
F I G. 2A
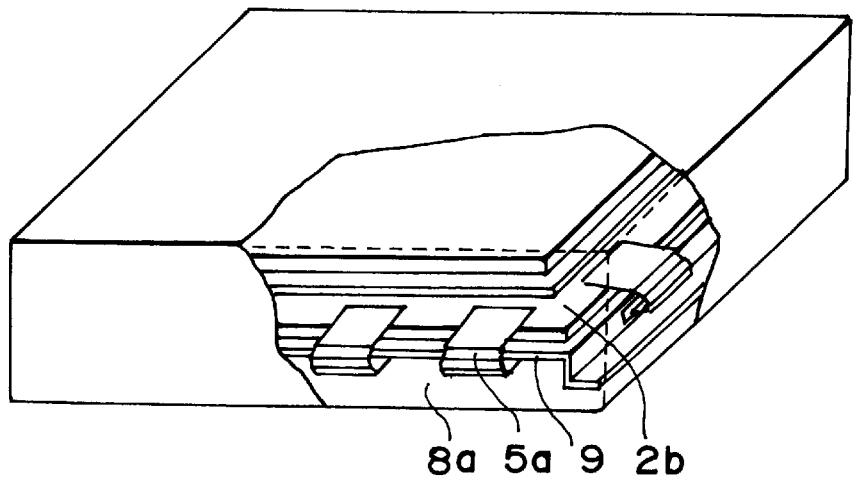
F I G. 2B

TWO-DIMENSIONAL IMAGE PICKUP APPARATUS

BACKGROUND OF THE INVENTION

1. Field of the Invention

This invention relates to a two-dimensional image pickup apparatus and, more particularly, it relates to a two-dimensional image pickup apparatus adapted to read information originating from radiation such as radiation of X-rays.

2. Related Background Art

FIG. 1 of the accompanying drawings schematically illustrates a known image pickup apparatus adapted to X-ray photography and comprising a fluorescent member (e.g. scintillator) 1 operating as wavelength converter for converting X-rays 101 into rays within the sensible wavelength range of photoelectric converters 2a such as those of visible light, photoelectric converters 2a for converting the visible light into electric signals, a substrate 2b carrying the photoelectric converters 2a thereon, a base member 7 supporting the substrate 2b thereon, circuit boards 5a, 5b for processing electric signals produced by photoelectric conversion, wires connected to the circuit boards and an apparatus cabinet 8a containing the above components.

The substrate 2b arranged under the photoelectric converters 2a is typically made of glass because it is required to be free from chemical reactions with the semiconductor devices (such as the photoelectric converters) of the apparatus, resist the high temperature of the semiconductor forming process and maintain dimensional stability. The fluorescent member 1 is prepared by applying a fluorescent material of a metal compound to a resin plate and held in close contact with the substrate 2b. When the photoelectric converters 2a are required to be moisture-impermeable, the fluorescent member 1 and the photoelectric converters 2a may be hermetically sealed by a moisture-impermeable and X-ray transmissive film 6.

Typically a printed circuit board made of glass epoxy is used for the circuit board 5b on which electronic parts 5c are mounted, to meet the requirement of being easily available and hardly inflammable. These and other components are secured to the base member 7 by way of spacers 3a an 3b and then to the apparatus cabinet and hermetically closed by means of an X-ray transmissive closure 8b.

In FIG. 1, reference symbol 3a denotes spacers arranged between the substrate 2b supporting the photoelectric converters and the base member 7 and reference symbol 3b denotes spacers arranged between the circuit board 5b and the base member 7, whereas reference symbol 5a denotes a flexible circuit board.

Such an image pickup apparatus is conventionally used for X-ray photography as a stationary apparatus. In recent years, there is an increasing demand for a lightweight, compact and portable image pickup apparatus adapted to rapid image pickup operations for producing fine images. However, with an apparatus having such a configuration, the heat generated by the electronic parts 5c is confined within the apparatus cabinet 8a to raise the internal temperature. Then, the temperature rise can by turn increase the internal noise and reduce the S/N ratio of the apparatus.

The use of a cooling system comprising one or more cooling fans (not shown) arranged in the apparatus cabinet 8a has been contemplated to sufficiently prevent such temperature rise from occuring in the inside. However, such an additional system can significantly increase the size and weight of the image pickup apparatus particularly because it requires pillars and a power source for driving the system.

SUMMARY OF THE INVENTION

In view of the above described circumstances, it is therefore an object of the present invention to provide a small, down-sized image pickup apparatus that is free from the above identified problems.

Another object of the present invention is to provide a two-dimensional image pickup apparatus adapted to stably reading information without significantly increasing the internal noise and reducing the S/N ratio if heat is generated by the electronic parts during the operation of the apparatus.

Still another object of the present invention is to provide an image pickup apparatus adapted to obtaining transmitted X-ray images for diagnosis and analysis.

Still another object of the present invention is to provide a low cost cassette-type image pickup apparatus that is small and lightweight and can be carried with ease.

According to an aspect of the invention, the above objects of the invention are achieved by providing a two-dimensional image pickup apparatus comprising two-dimensional photoelectric converters arranged on a substrate, a base member for supporting the substrate, electronic parts for processing the electric signals of said photoelectric converters and an apparatus cabinet containing the above components, said base member being formed by a metal-based printed circuit board, said electronic parts being mounted on said base member.

According to another aspect of the invention, in an image pickup apparatus according to the invention, said base member and part or all of said apparatus cabinet are formed by a metal-based printed circuit board and said electronic parts are mounted on said printed circuit board.

BRIEF DESCRIPTION OF THE DRAWINGS

FIG. 1 is a schematic cross sectional view of a typical two-dimensional image pickup apparatus.

FIGS. 2A and 2B are respectively a schematic cross sectional view and a schematic perspective view of a two-dimensional image pickup apparatus comprising a metal-based board.

Figure 3:
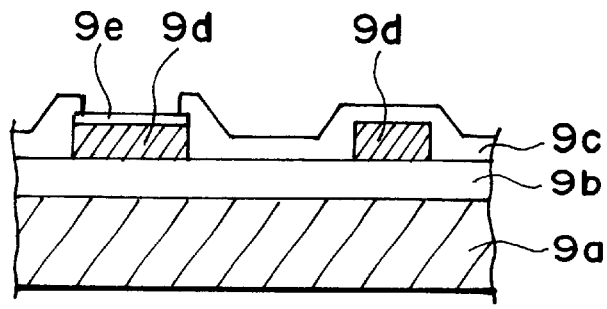
FIG. 3 is a schematic cross sectional view of a metal-based board.

DESCRIPTION OF THE PREFERRED EMBODIMENTS (First Embodiment)

Now, the present invention will be described in greater detail by referring to FIGS. 2A, 2B and 3 of the accompanying drawings that illustrate a first preferred embodiment of the invention. The components of the embodiment which are the same as those of the image pickup apparatus of FIG. 1 are denoted respectively by the same reference symbols and will not be described any further. Reference symbol 9 denotes a metal-based printed circuit board (hereinafter referred to as metal-based board) that operates as support structure for the substrate 2b. Reference symbol 5a denotes a flexible circuit board adapted to taking out electric signal from the photoelectric converters 2a and connected electrically to both the substrate 2b and the metal-based board 9.

FIG. 3 schematically illustrates the configuration of a typical metal-based board 9 that can be used for this embodiment. The metal base 9a of this board is a plate of iron, aluminum or copper. The actual material of the metal base 9a will be selected by taking the strength, the heat emitting performance, the weight and the manufacturing cost into consideration. An insulation layer 9a of an insulator material is formed on the surface of the metal base 9a and then a conductor circuit 9b is formed thereon by patterning an electrically conductive material such as copper foil.

The upper surface of the conductor circuit 9d is surface-treated by a layer 9e to protect it against oxidation and other possible adverse effects. The portions of the circuit that require insulation are covered by insulating solder resist 9c. The insulation layer 9b is typically made of resin such as polyimide, although a filler substance such as silica or aluminum powder may be mixed with it to raise its thermal conductivity.

With this embodiment, the apparatus is down-sized and its thermal conductivity is improved by using the base member 7 itself of FIG. 1 as printed circuit board.

The heat generated by the electronic parts 5c is transmitted to the metal-based board 9 and then to the apparatus cabinet 8a until it is finally transmitted to the ambient air surrounding the apparatus cabinet 8a, which dissipates the heat with ease. The heat emitting surface of the apparatus can be made sufficiently large to prevent any of the electronic parts 5c from operating erroneously due to heat by using an apparatus cabinet 8a that is made of a metal plate. With this arrangement, the apparatus cabinet does not require the use of any internal cooling system so that the image pickup apparatus can be further down-sized to reduce its weight.

(Second Embodiment)

Figure 4:
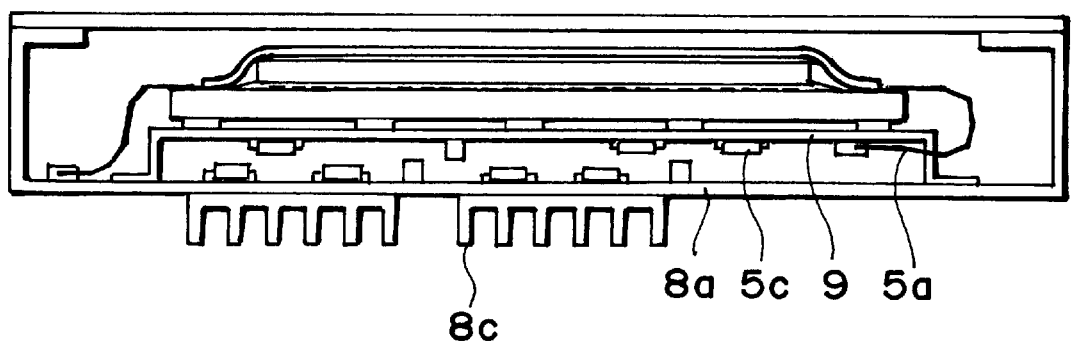
FIG. 4 is a schematic cross sectional view of another two-dimensional image pickup apparatus comprising a metal-based board.

FIG. 4 schematically illustrates a second embodiment of the invention. This embodiment may be useful when the heat emitting performance of the electronic parts 5c of the first embodiment is not satisfactory because, in addition to the metal-based board 9 per se, the apparatus cabinet 8a is partly or entirely made of metal-based board. As seen from FIG. 4, the cooling effect of the apparatus can be improved by rigidly fitting radiator fins 8c to the apparatus cabinet 8a.

As described above, according to the invention, there is provided a two-dimensional image pickup apparatus that is compact, lightweight and conveniently portable and adapted to X-ray photography.

Additionally, an image pickup apparatus according to the invention is free from the above identified problem of an increased noise level due to the heat generated by the electronic parts thereof so that it can read information more accurately and more reliably than ever.

Still additionally, an image pickup apparatus according to the invention can be made very compact, lightweight and conveniently portable at low cost because it can eliminate or minimize the cooling system typically comprising one or more cooling fans.

What is claimed is:

1. A two-dimensional image pickup apparatus comprising:
   a plurality of two-dimensional photoelectric converters arranged on a first side of a substrate, said two-dimensional photoelectric converters adapted and configured to output signals;
   a base member for directly supporting a side of the substrate opposite to the first side, said base member being formed by a metal-based printed circuit board;
   a plurality of electronic parts adapted and configured to receive the signals output from said photoelectric converters and to process the electric signals, said plurality of electronic parts being mounted on said base member; and
   an apparatus cabinet containing said plurality of two-dimensional photoelectric converters, said base member, and said plurality of electronic parts.

2. A two-dimensional image pickup apparatus according to claim 1, wherein said metal-based printed circuit board includes a metal base and an electrically conductive wiring material arranged on the metal base with an insulator material interposed therebetween.

3. A two-dimensional image pickup apparatus according to claim 2, wherein the electrically conductive wiring material is subjected to a patterning operation.

4. A two-dimensional image pickup apparatus according to claim 2, wherein the metal-based printed circuit board further includes an insulating protection layer formed at least on the electrically conductive material.

5. A two-dimensional image pickup apparatus according to claim 1, further comprising a flourescent body.

6. A two-dimensional image pickup apparatus comprising:
   a plurality of two-dimensional photoelectric converters arranged on a first side of a substrate, said two-dimensional photoelectric converters adapted and configured to output signals;
   a base member for directly supporting a side of the substrate opposite to the first side, said base member being formed by a metal-based printed circuit board;
   a plurality of electronic parts adapted and configured to receive the signals output from said photoelectric converters and to process the electric signals, said plurality of electronic parts being mounted on said base member; and
   an apparatus cabinet containing said plurality of two-dimensional photoelectric converters, said base member, and said plurality of electronic parts, said cabinet or a part thereof being formed by a metal-based printed circuit board.

7. A two-dimensional image pickup apparatus according to claim 6, wherein the metal-based printed circuit board includes a metal base and an electrically conductive wiring material arranged on the metal base with an insulator material interposed therebetween.

8. A two-dimensional image pickup apparatus according to claim 7, wherein the electronically conductive wiring material is subjected to a patterning operation.

9. A two-dimensional image pickup apparatus according to claim 7, wherein the metal-based printed circuit board further includes an insulating protection layer formed at least on the electrically conductive material.

10. A two-dimensional image pickup apparatus according to claim 6, wherein one or more than one radiator fins are connected to the metal-based printed circuit board.

11. A two-dimensional image pickup apparatus according to claim 6, wherein said base member formed by said metal-based printed circuit board is independent from said apparatus cabinet.

12. A two-dimensional image pickup apparatus according to claim 6, further comprising a flourescent body.

* * * * *

UNITED STATES PATENT AND TRADEMARK OFFICE
CERTIFICATE OF CORRECTION

PATENT NO. : 6,495,836 B1
DATED : December 17, 2002
INVENTOR(S) : Fumio Hata

It is certified that error appears in the above-identified patent and that said Letters Patent is hereby corrected as shown below:

Column 1,
Line 44, "an" should read -- and --.

Column 2,
Line 39, "cross sectional" should read -- cross-sectional --;
Line 41, "cross" should read -- cross- --;
Line 46, "cross sectional" should read -- cross-sectional --; and
Line 48, "cross sectional" should read -- cross-sectional --.

Column 4,
Line 17, "operation." should read -- operation to form a conductor circuit. --;
Line 19, "the" should read -- said --;
Line 21, "material." should read -- material to insulate the electrically conductive material. --;
Line 23, "flourescent" should read -- fluorescent --;
Line 51, "operation." should read -- operation to form a conductor circiut. --;
Line 53, "the" should read -- said --;
Line 55, "material." should read -- material to insulate the electrically conductive material. --;
Line 57, "one or more than one radiator fins are" should read -- at least one radiator fin is --;
Line 64, "flourescent" should read -- fluorescent --.

Signed and Sealed this

First Day of July, 2003

JAMES E. ROGAN
*Director of the United States Patent and Trademark Office*